United States Patent [19]

Phaneuf

[11] Patent Number: 4,546,543
[45] Date of Patent: Oct. 15, 1985

[54] METHODS OF AND APPARATUS FOR FORMING A PROJECTING LEAD

[75] Inventor: John B. Phaneuf, Haverhill, Mass.

[73] Assignee: AT&T Technologies, Inc., Berkeley Heights, N.J.

[21] Appl. No.: 562,955

[22] Filed: Dec. 19, 1983

[51] Int. Cl.$^4$ .................. H01R 43/00; B21F 21/00
[52] U.S. Cl. ........................................... 29/884; 140/1; 140/105
[58] Field of Search ................. 29/884; 140/1, 105, 140/106; 174/138 G; 72/381, 389, 403

[56] References Cited

U.S. PATENT DOCUMENTS

| | | |
|---|---|---|
| 3,157,220 | 11/1964 | Svoboda . |
| 3,378,047 | 4/1968 | Patterson . |
| 3,519,033 | 7/1970 | Pepin ........................................ 140/1 |
| 4,026,333 | 5/1977 | Keller .................................. 140/105 |

OTHER PUBLICATIONS

Western Electric Tech. Digest, No. 49, Jan. 1978, pp. 9–10, by G. R. Ciszak et al.

*Primary Examiner*—Mark Rosenbaum
*Assistant Examiner*—Carl J. Arbes
*Attorney, Agent, or Firm*—Stanley I. Rosen

[57] ABSTRACT

Projecting leads (28) on a support container (16) for a mini-oscillator assembly (14) initially are straightened in perpendicular directions in a lead-straightening mechanism (48). The straightened leads (28) then are reverse-bent in a bending mechanism (50), utilizing contact pads (26) on a substrate (22) of the mini-oscillator assembly (14) as anvils, so that the lead outer end portions retain the assembly adjacent the support container and so that the lead outer end portions can be bonded to the contact pads. Seating of the lead outer end portions (59) firmly on the contact pads (26) is insured by a lead-seating mechanism 60. The lead-bending mechanism 50 also applies pressure to the substrate (22) in the lead-bending operation to cause uniform spreading of an adhesive material (33) between the substrate and the support container (26).

7 Claims, 10 Drawing Figures

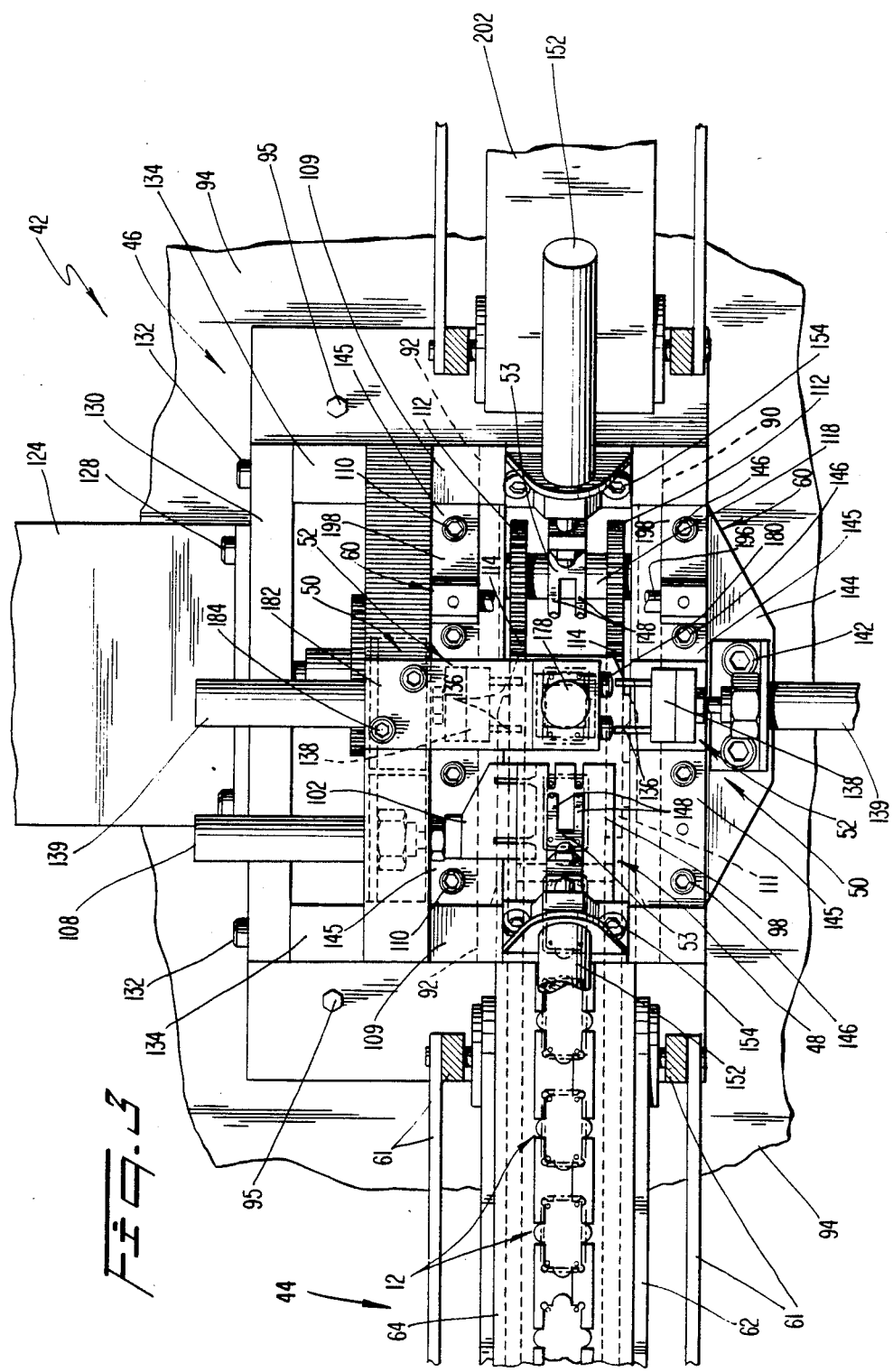

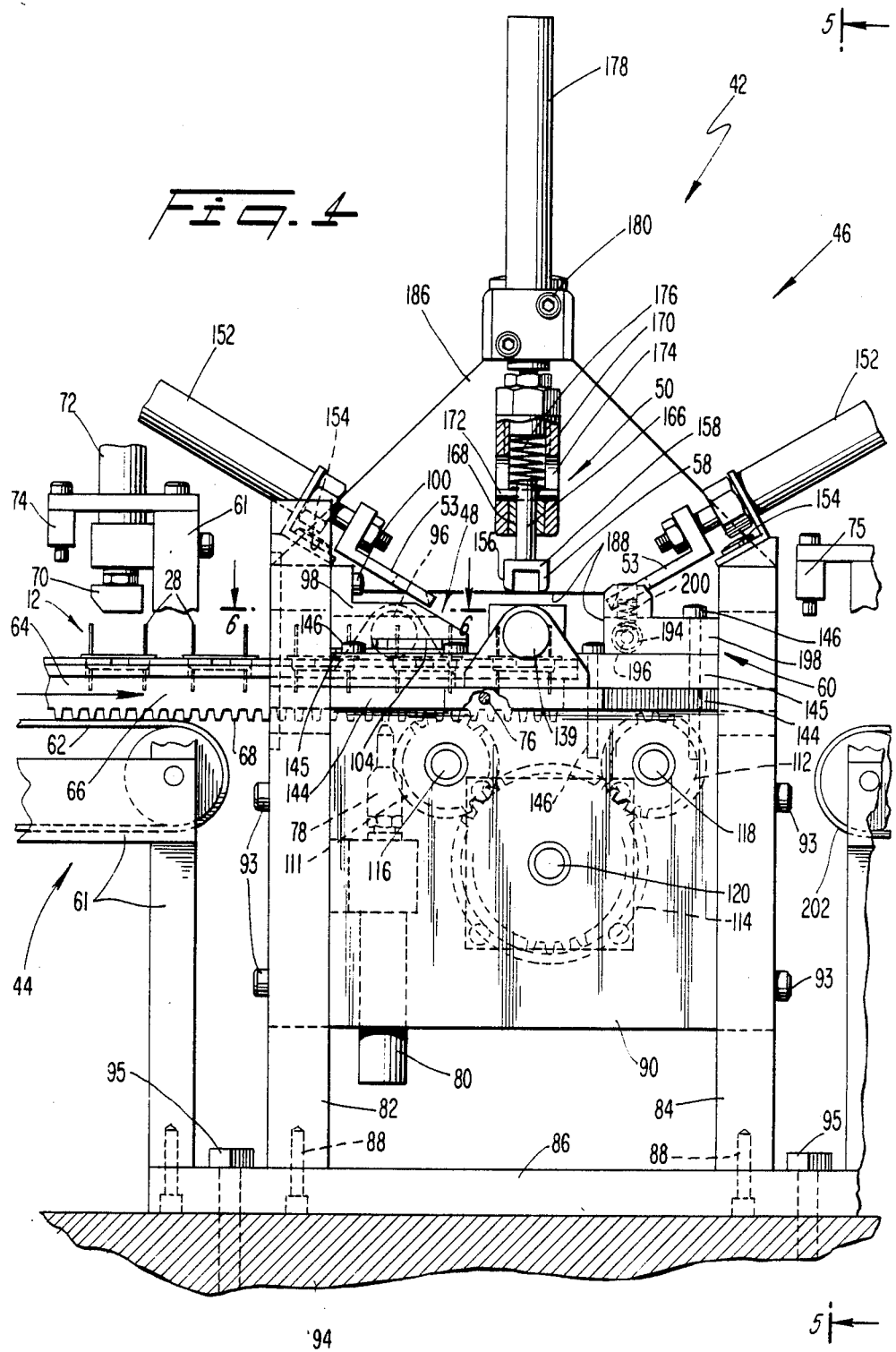

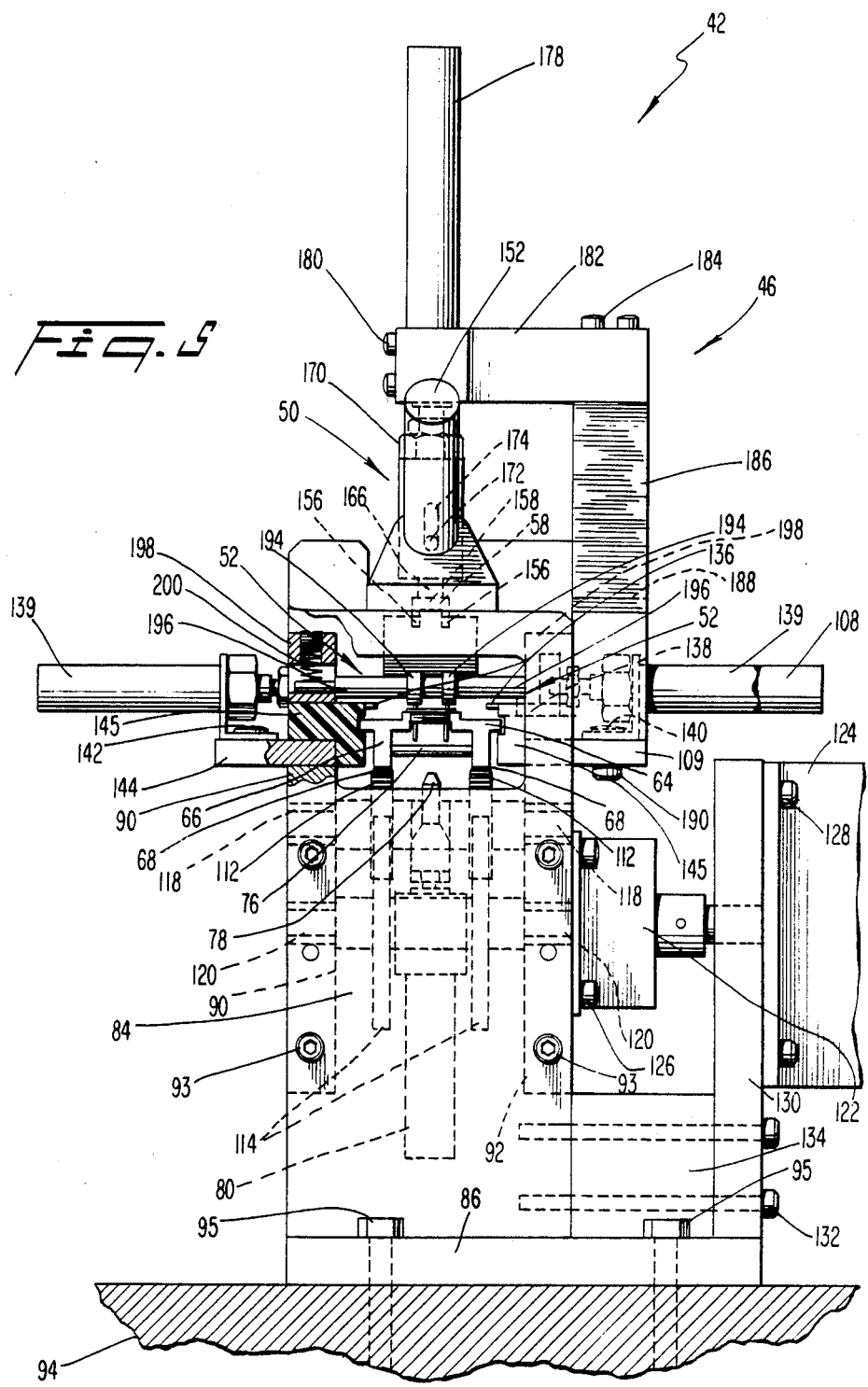

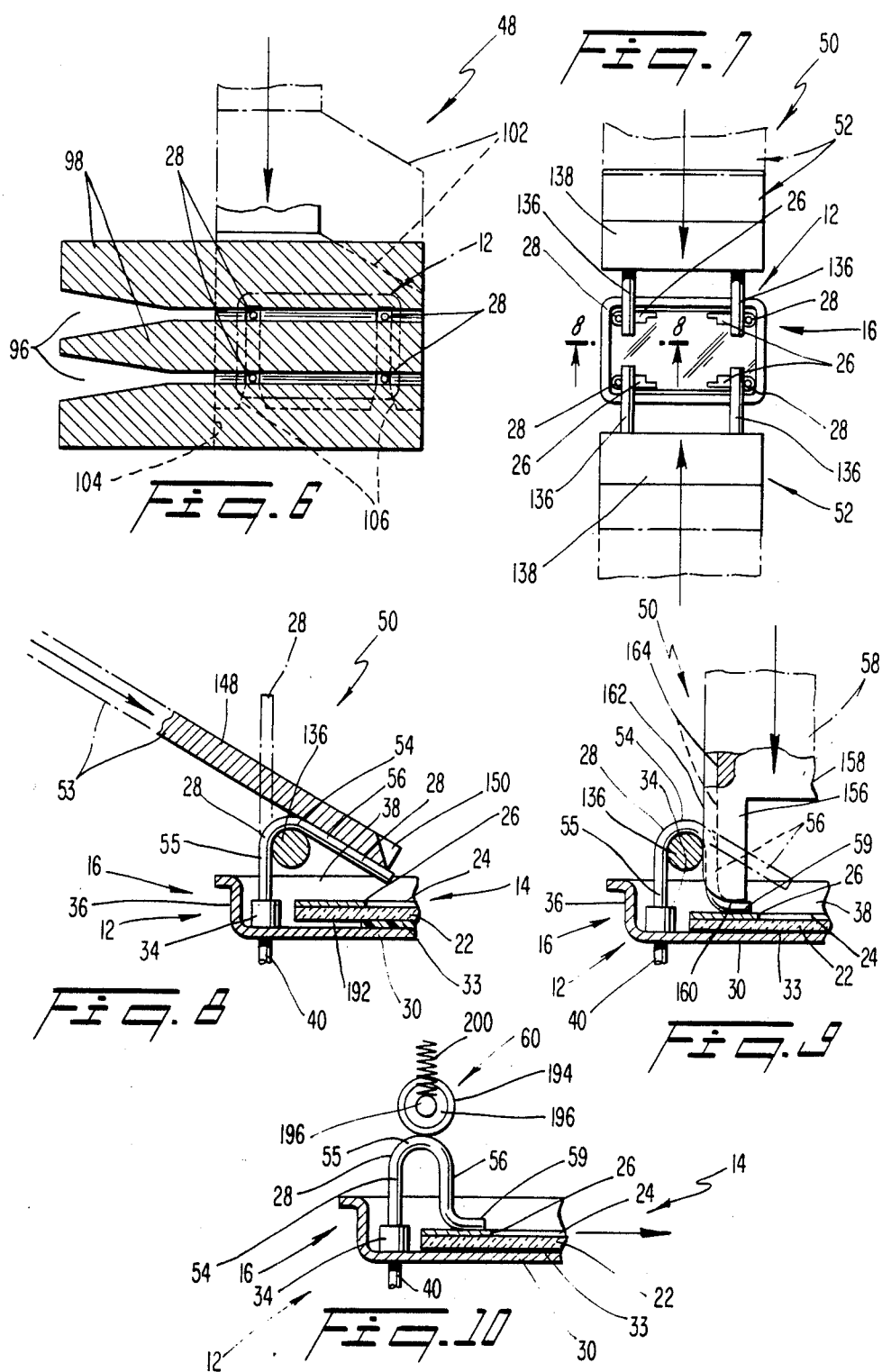

METHODS OF AND APPARATUS FOR FORMING A PROJECTING LEAD

TECHNICAL FIELD

This invention relates to methods of and apparatus for forming a projecting lead, and more particularly to methods of and apparatus for simultaneously forming a plurality of projecting leads on a support container into bonding positions adjacent contacts of an electronic substrate device positioned in the support container, without breakage and/or damage of the leads and/or the device.

BACKGROUND OF THE INVENTION

In a known mini-oscillator comprising a crystal resonator plate mounted on a thin film substrate of a hybrid integrated circuit device, the substrate is mounted in an open header or support container for supporting the mini-oscillator on another substrate, such as a printed circuit board. More specifically, the thin film substrate is bonded to a bottom wall of the container by heat-cured thermally conductive epoxy adhesive, which also functions as a heat sink for thin film and integrated circuits on the substrate. Further, the container includes flexible relatively thin leads which project internally of the container and which are formed and bonded, by heat-cured electrically conductive epoxy adhesive, to respective contact pads on the thin film substrate. The thin leads are electrically connected to rigid relatively thick support leads which project externally of the container for mounting the container, and thus the mini-oscillator, on the printed circuit board. When fabrication of the mini-oscillator has been completed, a cover member is mounted over the open container and the mini-oscillator is hermetically sealed within the container. A mini-oscillator of this type is disclosed in U.S. Pat. No. 4,494,033 issued to the same assignee as the subject application.

In an initial stage of the manufacture of the above-described mini-oscillator, the thermally conductive epoxy adhesive is dispensed adjacent the center of the bottom wall of the support container and the thin film substrate then is positioned on the bottom wall of the container. Heretofore, the thin film substrate then has been manually pressed against the container bottom wall to cause spreading of the adhesive between the substrate and the bottom wall, prior to forming the flexible thin leads of the container. The flexible thin leads then have been formed with a manual bending tool (e.g., tweezers) from an essentially straight-line configuration into a bent configuration in which free end portions of the leads can be bonded to the contact pads on the thin film substrate.

A disadvantage of the foregoing procedure is that, in the manual pressing of the thin film substrate against the container bottom wall, extreme care must be exercised so as not to engage and damage the thin film and integrated circuits on the substrate. In addition, if the substrate is not pressed uniformly against the container bottom wall so as to produce essentially uniform spreading of the adhesive between the substrate and the bottom wall, the heat-curing rate and the effectiveness of the adhesive as a heat sink are reduced. Further, in the manual bending of the thin leads, the leads tend to break off at points at which they project from the support container and/or to be scratched or otherwise damaged by the manual bending tool. The manual forming of the leads also is relatively slow and inefficient, and therefore not suitable where large production volumes are involved. In this regard, the manual forming of the leads cannot be accomplished readily because sidewalls of the container project upward above the thin film substrate therein closely adjacent the contact pads, making access to the contact pads and the forming of the outer free end portions of the leads into firm engagement with the contact pads extremely difficult.

Accordingly, a purpose of this invention is to provide new and improved methods of and apparatus for simultaneously forming the thin flexible leads of the mini-oscillator support container into a configuration in which outer end portions of the leads readily can be bonded to the contact pads of the mini-oscillator thin film substrate. At the same time, the thin film substrate is pressed uniformly against the bottom wall of the container so as to spread the thermally conductive epoxy adhesive between the substrate and the bottom wall into a uniform layer therebetween.

SUMMARY OF THE INVENTION

In general, a lead which projects from a first surface portion is initially formed by bending an intermediate section of the lead in a first direction with respect to an inner section of the lead which is adjacent the first surface portion, such that an outer section of the lead extends at an inclined angle with respect to a second surface portion. An outer end portion of the lead outer section then is engaged against the second surface portion as an anvil and bent in a second opposite direction into a position adjacent and parallel to the second surface portion.

More specifically, the first surface portion, from which the lead projects, is on a support member and the second surface portion is on a device positioned on the support member. Initially, the lead is straightened in directions perpendicular to one another by receiving the lead sequentially in guide slots extending perpendicularly to one another. The initial bending of the intermediate section of the straightened lead then is accomplished by disposing a mandrel adjacent the lead and moving a bending member adjacent to the mandrel to engage the lead and to bend the intermediate section of the lead about the mandrel. A unitary reverse-bend forming member next initially engages the inclined outer section of the lead at a point removed from the lead outer end portion, and then slides along the lead outer section into engagement with the lead outer end portion while bending the lead intermediate section further about the mandrel. The forming member then causes the lead outer end portion to engage against the second surface portion as an anvil to bend the lead outer end portion in the second opposite direction and into the position adjacent and parallel to the second surface portion on the device, so as to preclude the device from any substantial movement away from the support member. At the same time, the forming member forms an innermost portion of the lead outer section into a position extending essentially perpendicular to the second surface portion.

The forming member also simultaneously presses the device firmly against the support member to cause essentially uniform spreading of a bonding-and-heat sink material between the device and the support member. Subsequently, the bent intermediate section of the lead may be engaged and depressed by a seating mechanism toward the second surface portion on the device to compensate for any spring-back in the lead which occurred upon retraction of the forming member and to seat the formed outer end portion of the lead firmly on the second surface portion. A plurality of leads which project from respective first surface portions also may be formed into positions against respective second surface portions simultaneously, with certain of the leads being formed simultaneously toward one another into opposed facing relationship.

BRIEF DESCRIPTION OF THE DRAWING

FIG. 3 is a plan view of an apparatus in accordance with the invention;

FIG. 4 is a front elevational view of the apparatus shown in FIG. 3;

FIG. 5 is a side elevational view of the appartus shown in FIGS. 3 and 4, as seen along the line 5-5 in FIG. 4;

FIG. 6 is an enlarged schematic cross-sectional view taken along the line 6-6 in FIG. 4 and illustrating a lead-straightening step performed by the apparatus shown in FIGS. 3, 4 and 5; and FIGS. 7, 8, 9 and 10 are enlarged schematic views illustrating additional sequential steps in the operation of the apparatus shown in FIGS. 3, 4 and 5.

DETAILED DESCRIPTION

Figure 1:
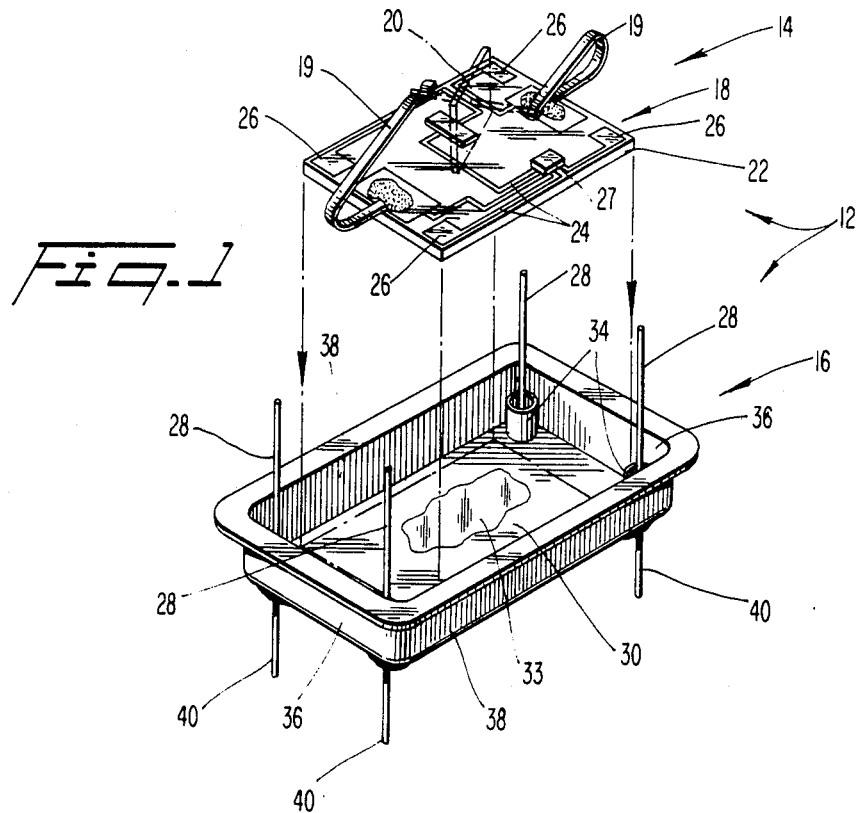
FIG. 1 is an isometric exploded view of an article assembly which may be fabricated utilizing the invention.

Referring to FIG. 1, an article assembly 12 which may be fabricated utilizing the subject invention includes a mini-oscillator assembly 14 and a head or support container 16 in which the mini-oscillator assembly is to be mounted. The mini-oscillator assembly is of a type as disclosed in U.S. Pat. No. 4,494,033 issued to the same assignee as the subject patent application. In this connection, the mini-oscillator assembly 14 includes a hybrid integrated circuit device 18 having a ribbon leads 19 upon which a crystal resonator plate 20 is subsequently mounted, as shown in solid lines in FIG. 2, in a separate processing step, not shown. The hybrid integrated circuit 18 also includes a ceramic substrate 22 comprising suitable thin film circuits 24 having contact pads 26 formed at respective corners of the substrate. One or more hybrid integrated circuit chip devices 27 also are mounted on the substrate 22.

Figure 2:
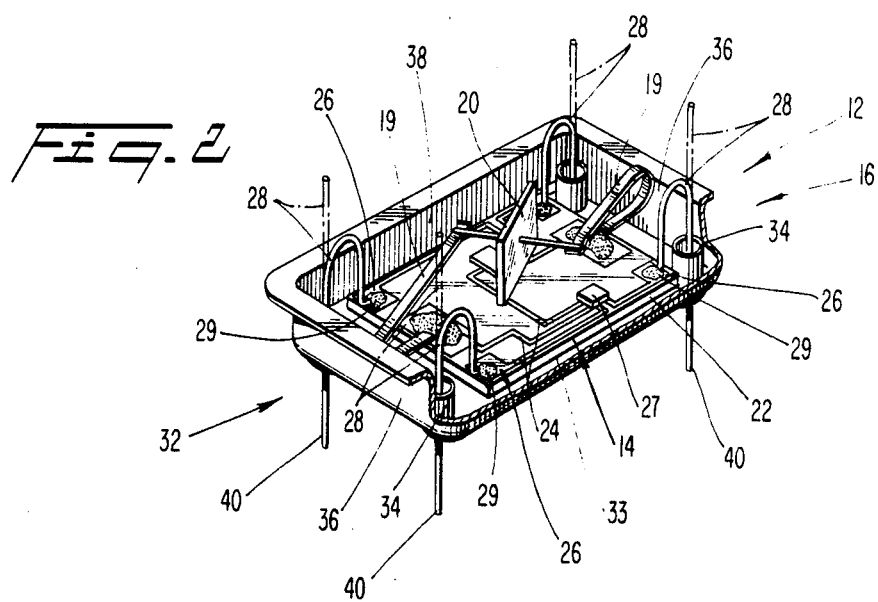
FIG. 2 is an isometric view of a mini-oscillator device which includes the article assembly of FIG. 1.

The support container 16 includes a plurality of projecting flexible leads 28, as shown in FIG. 1, which are formed into positions as shown in FIG. 2 utilizing the subject invention. The formed leads 28 subsequently are bonded to the contact pads 26 of the mini-oscillator assembly 14 utilizing a heat-curable electrically conductive epoxy adhesive material 29, as shown in FIG. 2. The thin film substrate 22 also is sibsequently bonded to a bottom wall 30 of the support container 16 utilizing a heat-curable thermally conductive epoxy adhesive material 33 (FIG. 1), which is dispensed onto the container bottom wall 30 adjacent the center thereof prior to positioning the substrate in the container, and which subsequently also functions as a heat sink for the hybrid integrated circuit device 18. The epoxy adhesive materials 29 and 33 each may be of a known type which permits relative movement between the support container 16 and the substrate 22 prior to being heat-cured, including removal of the substrate from the support container, if necessary. Ultimately, a completed mini-oscillator device 32 as shown in FIG. 2, including the crystal resonator plate 20 mounted on the ribbon leads 19, is provided with a hermetically sealed cover member, not shown.

With further reference to FIGS. 1 and 2, the leads 28 project from small cylindrical housings 34 of the suport container 16 adjacent respective corners thereof. The small cylindrical housings 34 project upward from the bottom wall 30 of the support container 16 closely adjacent intersections of eand walls 36 and side walls 38 of the container. The support container 16 also comprises a plurality of rigid mounting leads 40 which project externally of the container from the small cylindrical housings 34 for mounting the completed device 32, as shown in FIG. 2, on a substrate, such as a printed circuit board, not shown. Lower ends of the flexible leads 28 and upper ends of the rigid leads 40, which have been bonded together (e.g., butt welded), are disposed within the small cylindrical housings 34 in a suitable electrical insulating material, such as glass, in a manner not shown.

In general, referring to FIG. 3-5, apparatus 42 for forming the flexible leads 28 on the support container 16 so that the leads can be bonded to the contact pads 26 on the mini-oscillator substrate 22 includes a transport mechanism 44 (FIGS. 3 and 4) for advancing the article assemblies 12 into a lead forming station 46 in sequence. In the lead forming station 46, referring to FIG. 6, each of the article assemblies 12 initially is advanced into a lead straightening mechanism 48. The lead straightening mechanism 48 straightens each of the the flexible leads 28 of each article assembly 12 in directions perpendicular to one another and locates the leads in preselected vertical orientations for subsequent fabrication in a lead bending mechanism 50 of the lead forming station 46, as illustrated in FIGS. 7, 8 and 9.

The lead-bending mechanism 50 includes a pair of opposed mandrel assemblies 52 (partially shown in FIG. 7) and a pair of lead bending bars 53 (one partially shown in FIG. 8). The mandrel assemblies 52 and the lead bending bars 53 cooperate to produce initial bending of intermediate sections 54 of the leads 28 with respect to inner sections 55 of the leads in respective first directions such that outer sections 56 of the leads extend in downwardly inclined positions above their respective contact pads 26, as illustrated in FIG. 8.

Referring to FIG. 9, a unitary reverse-bend forming member 58 of the lead-bending mechanism 50 then engages the inclined outer section 56 of each lead 28 and cooperates with the mandrel assemblies 52 to cause further bending of the leads 28 in their respective first directions. The reverse-bend forming member 58 then forces an outer free end portion 59 of each lead outer section 56 against the adjacent contact pad 26, utilizing the contact pad as an anvil, to bend the outer free end portion in an opposite reverse direction into a position closely adjacent and essentially parallel to the contact pad. The formed lead outer free end portions 59 then retain the substrate 22 against any substantial movement away from the bottom wall 30 of the support container 16. At the same time, the reverse-bend forming member 58 presses the substrate 22 firmly against the bottom wall 30 of the support container 16 and causes uniform spreading of the epoxy adhesive material 33 between the substrate and the bottom wall, as illustrated in FIG. 9.

Further, referring to FIG. 10, as the article assemblies 12 are advanced from the lead bending mechanism 50, the bent intermediate portions 54 of each lead 28 are depressed by a lead-seating mechanism 60 to compensate for any spring-back of the outer free end portion 59 of the lead away from the contact pad 26, thereby insuring that the formed lead outer free end portion is seated firmly against the contact pad. Thereafter, the formed lead outer free end portions 59 retain the substrate 22 firmly against the bottom wall 30 of the support container 16 as the article assembly 12 is subjected to additional processing.

More specifically, referring to the left-hand side of FIGS. 3 and 4, the transport mechanism 44 comprises a support frame 61 and a suitable belt conveyor 62 for transporting the article assemblies 12 into the lead forming station 46. In this connection, the article assemblies 12 are pre-loaded in respective essentially rectangular openings in a magazine 64 in the form of an elongated bar member, at a point removed from the lead forming station 46. The pre-loaded bar member magazine 64 then is positioned on the belt conveyor 62 and advanced by the conveyor toward the lead forming station 46. Referring to FIG. 5, the bar member magazine 64 has an inverted U-shaped configuration in cross-section and includes a pair of depending side legs 66 having gear racks 68 (one also shown in FIG. 4) formed on lower edges thereof. The conveyor 62 is driven by a suitable power source (not shown), including a slip-clutch mechanism (not shown).

Referring again to FIG. 4, the magazine 64 is advanced by the belt conveyor 62 toward the lead-forming station 46 until a leading end of the magazine engages a vertically retractable stop member 70. The stop member 70 is supported on a lower end of a piston rod of a vertically disposed air cylinder 72 suitably mounted on an upper extension of the support frame 61 of the transporter mechanism 44. A photcell sensor 74, for detecting the presence of the magazine 64, also is suitably mounted on the upper extension of the support frame 61 above the belt conveyor 62 and adjacent the stop member 70.

When the photocell sensor 74 detects the presence of the magazine 64, the sensor transmits a signal to a microprocessor controller (not shown). Subsequently, when the microprocessor controller (not shown) receives another signal from another photocell sensor 75 (right-hand side of FIG. 4) suitably mounted at an exit end of the lead forming station 46, indicating that a previous one of the magazines 64 has cleared the station, the microprocessor controller energizes the air cylinder 72 to raise the stop member 70. The belt conveyor 62 then continues to advance the magazine 64 into the lead forming station 46 until a horizontal stop bar 76 (FIGS. 4 and 5), which extends between the magazine side legs 66 at a point spaced from a leading end of the magazine, engages a vertically movable stop pin 78 (FIGS. 4 and 5) to locate the magazine in a zero reference "start" position in the lead forming station 46. The belt conveyor 62 then continues to be driven, through the above-mentioned slip clutch mechanism (not shown), so as to hold the horizontal stop bar 76 of the magazine 64 firmly against the vertical stop pin 78.

The stop pin 78 is mounted on an upper end of a piston rod of a vertically disposed air cylinder 80 mounted on an adjacent one of two spaced side vertical frame plates 82 and 84 of the lead forming station 46. The side vertical frame plates 82 and 84 are secured adjacent their lower ends to a base plate 86 by screws 88 and are interconnected by a front vertical frame plate 90, a back vertical frame plate 92 (FIG. 5) and screws 93. The base plate 86 is secured to a support table 94 by screws 95.

As the horizontal stop bar 76 of the magazine 64 is advanced toward and against the vertical stop pin 78, the first article assembly 12 in the magazine is advanced into the lead-straightening mechanism 48 (FIGS. 4 and 6) of the lead forming station 46. More specifically, the thin flexible leads 28 of the first article assembly 12 enter respective ones of a pair of spaced downwardly open parallel slots 96 (best shown in FIG. 6) in a lower portion of a lead-straightening block 98. The slots 96 are formed with flared entrance ends (FIG. 6) which taper toward opposed side walls for receiving the leads 28 in the slots in close relationship. Thus, opposite side portions of the walls of the slots 96 straighten the leads 28 in a first direction perpendicular to the direction of advancement of the article assemblies 12 as the leads are moved through the slots. The lead-straightening block 98 is secured, by an upper integral flange and screws 100 (FIG. 4), to an upper portion of the adjacent side vertical frame plate 82 of the lead-forming station 46.

After the flexible leads 28 of the first article assembly 12 have been located in the slots 96 in the lead-straightening block 98 by engagement of the magazine stop bar 76 with the vertical stop pin 78, a horizontally disposed lead-straightening plate 102 (FIGS. 3 and 6) is advanced transversely of the path of travel of the article assemblies 12. The advancing lead-straightening plate 102 passes slightly above the top of the first article assembly 12 and through a transversely extending passageway 104 (FIGS. 4 and 6) defined by a right angle cut-out portion in the underside of the lead-straightening block 98. As the lead-straightening plate 102 advances, respective pairs of the flexible leads 28 are received in a pair of parallel aligning slots 106 (FIG. 6) in the plate in close relationship to side walls of the slots to straighten the leads in a second direction parallel to the direction of travel of the article assemblies 12. Thus, the slots 96 in the lead-straightening block 98 and the slots 106 in the lead-straightening plate 102 cooperate to align the flexible leads 28 accurately into vertically-extending orientations for subsequent forming of the leads in the lead bending mechanism 50.

The lead-straightening plate 102 is supported on a piston rod of a horizontally disposed air cylinder 108 (FIGS. 3 and 5) suitably mounted on a horizontal support plate 109 secured by screws 110 (FIG. 3) to the top of the back vertical frame plate 92. After advancing the lead-straightening plate 102, the air cylidner 108 is operated in a reverse direction to move the lead-straightening plate back to its initial retracted position.

Referring to FIG. 4, the horizontal stop bar 76 of the magazine 64 is located from the leading end of the magazine a distance such that as the stop bar engages the vertical stop pin 78, several gear teeth on the leading end portions of the gear racks 68 on the lower ends of the magazine side legs 66 engage with respective ones of a first set of secondary drive gears 111. The first set of secondary drive gears 111, and a second set of secondary drive gears 112 (FIGS. 3, 4 and 5), mesh with respective ones of a set of primary drive gears 114 (FIGS. 4 and 5). The secondary drive gears 111 and 112 are suitably secured to support shafts 116 (shown only in FIG. 4) and 118, respectively. Opposite ends of the support shafts 116 and 118 are journaled in the front vertical frame plate 90 and the back vertical frame plate 92, respectively. Similarly, the primary drive gears 114 are secured to a drive shaft 120 having opposite ends journaled in the front and back vertical frame plates 90 and 92, respectively. As is best shown in FIG. 5, one end of the drive shaft 120 also is connected by a clutch coupling 122 to a suitable stepping motor 124. The clutch coupling 122 is secured by screws 126 to the bak vertical frame plate 92. The stepping motor 124 is mounted by screws 128 adjacent an upper end of a vertical support plate 130 secured adjacent a lower end to the side vertical frame plates 82 and 84 by screws 132 extending through spacer blocks 134.

When the lead-straightening plate 102 has been retracted to its initial position, the belt conveyor 62 is de-energized. At the same time, the stop pin air cylinder 80 is energized to retract the vertical stop pin 78. The stepping motor 124 then is operated to cause the first set of secondary drive gears 111 (FIG. 4) to advance the magazine 64 from its zero reference "start" position (as defined by the vertical stop pin 78) a preselected distance toward the lead bending mechanism 50. After a predetermined number of steps, the stepping motor 124 is stopped to locate the first article assembly 12 which is in the magazine 64 accurately in the lead-bending mechanism 50, and to locate a second of the article assemblies which is in the magazine accurately in the lead-straightening mechanism 48 for a lead-straightening operation as described hereinabove.

After the first article assembly 12 has been located in the lead-bending mechanism 50, the mandrel assemblies 52 (FIGS. 3, 5, and 6) are advanced from the front and back of the lead forming statin 46 simultaneously. As is best shown in FIG. 7, each mandrel assembly 52 includes a pair of spaced parallel cylindrical mandrels 136 projecting from a support block 138. Referring to FIGS. 3 and 5, each support block 138 is mounted on a piston rod of an air cylinder 139. A back one of the air cylinders 139 is secured by a bracket and screws 140 (FIG. 5 only) to the horizontal support plate 109 on the back vertical frame plate 92. A front one of the air cylinders 139 is mounted by a suitable bracket and screws 142 (FIGS. 3 and 5) on a front horizontal support plate 144. The support plate 144 is secured by screws 146 (FIG. 3) to the top of the front vertical frame plate 90.

Referring to FIGS. 3 and 4, pairs of front and back plastic guide members 145 are located on opposite sides of the front and back mandrel assemblies 52, respectively, for guiding the bar magazine 64 through the lead forming station 46. As is best shown at the left-hand side of FIG. 5, each of the plastic guide members 145 is of right-angle construction, having an inner vertical slotted guide leg and a horizontal support leg engaged against respective surfaces of the front horizontal support plate 144 (left-hand side of FIG. 5) or back horizontal support plate 109 (right-hand side of FIG. 5), respectively. The guide members 145 are retained on their respective horizontal support plates 109 and 144 by the support plate mounting screws 110 (FIG. 3) and 146 (FIGS. 3 and 4), respectively.

Referring to FIG. 7, as the mandrel assemblies 52 are advanced the mandrels 136 move slightly above the top of the first article assembly support container 16 into positions closely adjacent respective ones of the upstanding flexible leads 28. As is illustrated in FIG. 8 by the left-hand side of the first article assembly 12, the pair of inclined lead-bending bars 53 then are advanced downwardly at an inclined angle from opposite sides of the lead forming station 46, to bend the flexible leads 28 about their adjacent mandrels 136 and into downwardly inclined positions, such as at an angle of 30°. For this purpose, as is best shown in FIG. 3, each lead-bending bar 53 is of bifurcated construction and includes a pair of spaced lead-bending fingers 148. Each lead-bending finger 148 has a V-shaped tapered guide notch 150 (FIG. 8) formed in an outer end thereof for receiving and guiding the associated lead 28 during the bending operation. As is best shown in FIG. 4, each lead-bending bar 53 is supported on a piston rod of an air cylinder 152 mounted by screws 154 at the upper end of the side vertical frame plate 82 or 84, respectively. After the flexible leads 28 have been bent over the adjacent mandrels 136, the air cylinders 152 are energized to retract the lead-bending bars 53 to their initial positions as shown in FIG. 4.

The unitary reverse-bend forming member 58, which is best shown in FIG. 4, then is moved vertically downward to complete bending of the flexible leads 28 about their respective mandrels 136 and to reverse-bend the outer free end portion 59 on each lead as shown in FIG. 9. For this purpose, the reverse-bend forming member 58 is of bifurcated construction in two directions, as shown in FIGS. 4 and 5, with four spaced forming legs 156 depending from respective corners of a bight portion 158. As is best shown in FIG. 9, a lower end portion of each leg 156 of the reverse-bend forming member 58 also has an arcuate reverse-bend forming surface 160 which merges into a vertical surface 162 defined by an upper portion of the leg and the bight portion 158. Each side of the bight portion 158 and the adjacent leg 156 also is formed with a vertical slot 164 (one shown in FIG. 9) which intersects the arcutate forming surface 160 of the leg for receiving a respective one of the flexible leads 28 during the reverse-bending of the leads.

Referring to FIG. 4, the bright portion 158 of the reverse-bend forming member 58 is formed integrally with an upwardly extending cylindrical rod portion 166 of the member. The cylindrical rod portion 166 extends slidably through a bushing 168 force-fitted into a lower end portion of a vertical sleeve member 170. In addition, a horizontal retaining pin 172 is force-fitted through an upper end section of the cylindrical rod portion 166 and has opposite end portions disposed in respective vertical slots 174 in the sleeve member 170. The retaining pin 172, and thus the reverse-bend forming member 58, is biased toward lower ends of the slots 174 in the sleeve member 170 by a coil spring 176 in the sleeve member. The strength of the coil spring 76 determines and limits the degree of forming pressure which is applied to the leads 28 and the thin film substrate 22 by the reverse-bend forming member 58 so as to preclude damage to the leads and or the substrate during the reverse-bend forming operation.

An upper end of the sleeve member 170 is mounted on a lower end of a piston rod of a vertically disposed air cylinder 178. The air cylinder 178 is mounted by screws 180 on an outer end of a cantilevered horizontal arm 182 (FIG. 5) supported at an opposite end by screws 184 on an upper end of a triangular-shaped vertical support plate 186. Spaced lower leg portions of the vertical support plate 186, on opposite sides of a cutaway portion 188 (best shown adjacent the center of FIG. 4), are secured by screws 190 (one shown at the right-hand side of FIG. 5) to opposite end portions of the horizontal mounting plate 109 for the lead-straightening blade air cylinder 108 and the back mandrel assembly air cylinder 139, with the cut-away portion of the vertical support plate extending over the air cylinders in bridging relationship.

Referring to FIG. 9, as the spring-biased reverse-bend forming member 58 is moved vertically downward, the reverse-bend arcuate surface portion 160 of each leg 156 initially engages the inclined outer section 56 of the adjacent flexible lead 28 at a point intermediate the adjacent mandrel 136 and the outer free end portion 59 of the lead. Continued downward movement of the reverse-bend forming member 58 causes the arcuate surface portion 160 to slide along the inclined outer section 56 of the lead 28 as the lead outer section is bent further toward the adjacent contact pad 26. As the lead outer free end portion 59 subsequently engages the contact pad 26, the arcuate surface portion 160 forces the lead outer free end portion against the contact pad, utilizing the contact pad as an anvil to bend the outer free end portion counterclockwise as viewed in FIG. 9, and to form the outer free end portion into a horizontal foot portion which extends above the contact pad in retaining relationship to the substrate 22, as shown in FIG. 9. At the same time, the adjacent vertical guide slot 164 of the leg 156 receives an innermost portion of the lead outer section 56 to form the innermost portion into a position extending substantially perpendicular to the contact pad 26. The air cylinder 178 (FIG. 4) then is energized to retrace the reverse-bend forming member 58 vertically upward to its initial upper position as shown in FIG. 4. The air cylinders 139 also are then energized to retract the mandrel assemblies 52 to their retracted positions as shown in FIG. 3.

Referring to FIG. 8, when the thin film substrate 22 initially is positioned on the bottom wall 30 of the support container 16 as noted hereinabove, the epoxy adhesive material 33, which has been dispensed on the bottom wall in a relatively thick layer, normally does not flow to form a thin uniform layer which extends completely between the substrate and the bottom wall, as is illustrated by a peripheral space 192 therebetween in this figure. Thus, the time subsequently required to cure the epoxy adhesive material 33 is increased, and the capability of the cured material to function as a heat sink for peripheral portions of the hybrid integrated circuit 18 (FIG. 1) is reduced. In this connection, however, as indicated hereinabove, in accordance with this invention, at the same time that the legs 156 of the spring-biased reverse-bend forming member 58 form the leads 28 as illustrated in FIG. 9, the legs also apply pressure to the contact pads 26 at the corners of the substrate 22 to push the substrate into firm engagement with the container bottom wall 30, causing the epoxy adhesive material 33 to spread in a uniform thin layer between the substrate and the bottom wall, as illustrated in FIG. 9. Thus, the curing and heat-sink capabilities of the epoxy adhesive material 33 are enhanced. Further, since the pressure which is applied to the substrate 22 is limited by the strength of the biasing spring 176 (FIG. 4) for the reverse-bend forming member 58, and is concentrated only on the contact pads 26, possible damage to the substrate, including the thin film circuits 24 (FIG. 1) and the hybrid integrated circuit devices 27 on the substrate, is essentially eliminated.

After the mandrel assemblies 52 and the reverse-bend forming member 58 have been retracted, the stepping motor 124 is again operated for a predetermined number of steps to advance the magazine 64, and the article assemblies 12 which are in the magazine, through the lead-forming station 46 an additional preselected distance. More specifically, the first article assembly 12 in the magazine 64 is moved out of the lead-bending mechanism 50, the second article assembly in the magazine is moved into the lead-bending mechanism, and a third article assembly in the magazine is moved into the lead-straightening mechanism 48. The lead-straightening and lead-bending mechanism 48 and 50 then are again operated as above-described, to straighten and bend the flexible leads 28 of the third and second article assemblies 12, respectively.

Referring to FIGS. 4, 5 and 10, as the first article assembly 12 in the magazine 64 is advanced from the lead-bending mechanism 50 toward the exit end of the lead-forming staion 46, the bent intermediate sections 54 of the leads 28 one each side of the assembly ride beneath respective ones of a pair of spaced roller bearings 194 (not shown in FIGS. 4 and 10) of the lead-seating mechanism 60. The roller bearings 194 depress the bent lead intermediate sections 54 toward the contact pads 26 of the article assembly 12 to insure that the reverse-bent outer free end portions 59 of the leads 28 are firmly seated against the contact pads, thereby compensating for any spring-back of the leads when the reverse-bend forming member 58 is retracted as above described. The seated lead outer end portions 59 then retain the substrate 22 in firm engagement with the bottom wall 30 of the support container 16 during subsequent processing, as noted hereinabove. The roller bearings 194 are supported on a horizontal shaft 196 having opposite end stub portions disposed in vertical slots in spaced support blocks 198 (FIGS. 4 and 5) and biased downward by small coil springs 200 mounted in the support blocks. The support blocks 198 are secured on respective ones of the magazine guide members 145 by respective ones of the horizontal support plate mounting screws 110 (FIG. 3) and 146 (FIGS. 3 and 4).

As the magazine 64 is advanced through the lead-forming station 46 by the first set of secondary drive gears 111, the gear racks 68 on the magazine also engage the second set of secondary drive gears 112, which then cooperate with the first set of secondary drive gears to advance the magazine through and out of the station. In this connection, as the leading end of magazine 64 initially exits from the lead forming station 46, the magazine rides onto a second belt conveyor 202 (FIGS. 3 and 4), which is being driven in a suitable manner, not shown. Subsequently, after the leads 28 of the last article assembly 12 in the magazine 64 have been formed in the lead-bending mechanism 50, the above-mentioned controller (not shown) operates the stepping motor 124 for a sufficient number of steps to advance the magazine such that the magagazine gear racks 68 disengage from the second set of secondary drive gears 112, whereupon the second belt conveyor 202 transports the magazine and the article assemblies therein to a discharge position or a subsequent processing station (not shown). As the trailing end of the magazine 64 clears the lead forming station 46, the photocell sensor 75 (FIG. 4) adjacent the exit end of the station transmits a signal to the controller (not shown) as described hereinabove, and the processing operation is repeated for the article assemblies 12 in a next one of the magazines 64 on the feed-in belt conveyor 62.

In summary, new and improved methods and apparatus have been disclosed for simultaneously forming leads, such as the leads 28 on the support container 16, whereby the leads readily can be bonded to adjacent surface portions, such as the contact pads 26 on the think film substrate 22. In this connection, initially the leads 28 are simultaneously straightened by the lead-straightening mechanism 48 (FIG. 6) in perpendicular directions and aligned into vertical orientations for subsequent processing in the lead-bending mechanism 50 (FIGS. 7, 8 and 9). The lead-bending bars 53 and the mandrels 136 of the lead-bending mechanism 50 then cooperate to bend the intermediate sections 54 of the leads 28 in respective first directions simultaneously, as shown in FIG. 8. Next, the forming legs 56 of the spring-loaded unitary reverse-bend forming member 58 cause reverse-bending of the outer free end portion 59 of each lead 28 in a second opposite direction, using the adjacent contact pad 26 as an anvil, such that the lead outer free end portion extends above the contact pad in retaining relationship to the substrate 22, as shown in FIG. 9. At the same time, the forming legs 56 also press the substrate 22 firmly against the bottom wall 30 of the support container 16 and cause uniform spreading of the heat-curable adhesive material 33 therebetween, as shown in FIG. 9. Subsequently, the lead-seating mechanism 60 depresses the bent intermediate sections 54 of the leads 28, as shown in FIG. 10, to insure that the reverse-bent outer free end portions 59 of the leads are seated firmly against the contact pads 26, so as to retain the substrate 22 against any substantial movement away from the bottom wall 30 of the support container 16 during subsequent processing.

What is claimed is:

1. A method of simultaneously forming leads which project from a first surface, which comprises:
   simultaneously bending intermediate portions of the projecting portions of said leads to form first and second lead portions, said second lead portions being inclined with respect to said first lead portions and said intermediate portions being in opposed facing relationship with each other; and
   simultaneously engaging said inclined second lead portions for movement of the ends thereof against a second surface, and thereby bending end portions of said leads into positions essentially parallel to said second surface.

2. The method of claim 1, in which said first surface is on a support member and said second surface is on a device positioned on said support member, and which further comprises:
   applying an adhesive material between said device and said support member; and
   pressing said end portions against said second surface and thereby causing uniform spreading of the adhesive material between said device and said support member to thereby preclude any substantial subsequent movement of said device away from said support member.

3. Apparatus for forming a lead which projects from a first surface, which comprises:
   support means;
   first lead bending means movably mounted on said support means for bending an intermediate portion of the projecting portion of said lead to form a first lead portion and a second lead portion inclined from said first lead portion;
   said first lead bending means including a mandrel mounted for movement into position adjacent said intermediate portion of said lead, and a bending member positioned for movement adjacent said mandrel for engaging said projecting lead portion and bending said intermediate portion about said mandrel to thereby form said first and second lead portions;
   second lead bending means positioned on said support means adjacent said mandrel for movement into engagement with said second inclined lead portion; and
   a second surface positioned relative to the end of said second inclined lead portion to cause the end portion of said second lead portion to bend, upon engagement of said second lead bending means with such second lead portion, in a direction appoximately parallel to said second surface.

4. The apparatus of claim 3, which further comprises: resilient means positioned for movement on said support means for engaging said intermediate portion of said lead subsequent to the bending thereof for biasing said intermediate portion toward said second surface.

5. The apparatus of claim 3, in which a plurality of said leads project from said first surface, and in which:
   said first lead bending means includes means for bending a pair of the intermediate portions simultaneously.

6. The apparatus of claim 5, in which:
   said first bending means is positioned on said support means for bending said intermediate portions to form bent leads in opposed facing relationship.

7. The apparatus of claim 5, in which said second surface includes second surface portions spaced from each other on a device positioned on said support member, and in which:
   adhesive material is provided between said support member and said device, and
   means is provided, operatively associated with said support means, for operating said second lead bending means with sufficient force simultaneously against the second inclined lead portions of a plurality of said leads to cause the resulting end portions of said leads to simultaneously engage said second spaced surface portions on said device and thereby cause said adhesive material to spread uniformly between said support member and said device.

* * * * *